(12) United States Patent
Chiu

(10) Patent No.: US 6,998,886 B1
(45) Date of Patent: Feb. 14, 2006

(54) APPARATUS AND METHOD FOR PLL WITH EQUALIZING PULSE REMOVAL

(75) Inventor: Hon K. Chiu, Hayward, CA (US)

(73) Assignee: National Semiconductor Company, Santa Clara, CA (US)

( * ) Notice: Subject to any disclaimer, the term of this patent is extended or adjusted under 35 U.S.C. 154(b) by 0 days.

(21) Appl. No.: 10/881,483

(22) Filed: Jun. 30, 2004

(51) Int. Cl.
*H03L 7/06* (2006.01)

(52) U.S. Cl. .................................. 327/150; 327/159

(58) Field of Classification Search ............... 327/147, 327/150, 159, 156, 162, 163; 331/17, 25; 375/373, 375
See application file for complete search history.

(56) References Cited

U.S. PATENT DOCUMENTS

| | | | |
|---|---|---|---|
| 4,364,091 A | * | 12/1982 | Taguchi et al. .............. 348/530 |
| 6,483,361 B1 | | 11/2002 | Chiu ........................... 327/159 |
| 6,642,747 B1 | | 11/2003 | Chiu ........................... 327/40 |

OTHER PUBLICATIONS

National Semiconductor Corporation, "Video Sync Separator", LM1881, LM1881-X, Jun. 2003, pp. 1-12.

* cited by examiner

*Primary Examiner*—Linh My Nguyen
(74) *Attorney, Agent, or Firm*—Darby & Darby PC; Matthew M. Gaffney

(57) ABSTRACT

A phase-locked loop circuit is arranged for equalizing pulse removal. The phase-locked loop circuit includes a multi-phase pulse generator circuit that is arranged to provide a feedback signal and a gate signal from an output of a voltage-controlled oscillation circuit. The gate signal leads the feedback signal by approximately one-fourth of a period. Also, an equalizing pulse removal logic circuit is arranged to provide a sync gate signal from the feedback signal, the gate signal, and a sync signal. The sync gate signal is provided such that, if the sync signal includes equalizing pulses, the sync gate signal corresponds to an inactive logic level during the equalizing pulses. A phase-frequency detector of the phase-locked loop circuit is gated such that the phase-frequency detector is not changed by the sync signal if the sync gate signal corresponds to the inactive logic level.

20 Claims, 11 Drawing Sheets

APPARATUS AND METHOD FOR PLL WITH EQUALIZING PULSE REMOVAL

FIELD OF THE INVENTION

The invention is related to phase-locked loops, and in particular, to an apparatus and method for a phase-locked loop with equalizing pulse removal.

BACKGROUND OF THE INVENTION

The NTSC standard for television defines a composite video signal. The composite video signal has a fixed vertical resolution of 525 horizontal lines, with 59.94 fields displayed per second. Even and odd fields are displayed sequentially, interlacing the full frame. One full frame is made of two interlaced fields, and is displayed about every $\frac{1}{30}$ of a second. A composite sync signal may be derived from the NTSC composite video signal by performing functions such as clipping and buffering on the composite video signal. There may be several commercially available integrated circuits for generating a composite sync signal from a composite video signal, including the LM1881 from National Semiconductor Corporation.

The composite sync signal includes a horizontal sync region with a period of about 63.5 $\mu$s. During a vertical blanking interval, the composite sync signal still includes the horizontal sync pulses with a period of about 63.5 $\mu$s. However, during the vertical blanking period, equalizing pulses are interleaved with the horizontal sync pulses. The equalizing pulses have a period of about 63.5 $\mu$s, and lag behind the horizontal sync pulses by about 31.75 $\mu$s (or 31.8 $\mu$s, rounding to three significant digits). Accordingly, the period of the NTSC composite sync signal is approximately 31.8 $\mu$s during the vertical blanking period. However, this increased frequency NTSC signal when equalizing pulses occur may be problematic if a phase-locked loop (PLL) is employed for horizontal deflection.

PLL applications typically provide an output clock signal by comparing the output clock signal to a reference clock signal. A phase-frequency detector (PFD) circuit is often employed to provide a raw control signal to a loop filter. The phase-frequency detector circuit provides the raw control signal in response to comparing the phase and frequency of the output clock signal to the reference clock signal. The loop filter often is a low-pass filter (LPF) that is arranged to provide a smoothed or averaged control signal in response to raw control signal. Typically, a voltage-controlled oscillator (VCO) is arranged to receive the control signal from the loop filter. The VCO produces the clock signal in response to the control signal such that the frequency of the clock is varied until the phase and frequency of the clock signal are matched to the reference clock signal.

A PLL circuit may include a PFD circuit that provides UP and DOWN signals in response to the comparison between the output clock signal and the reference clock signal. The UP and DOWN signals are dependent on both the phase and frequency of the output and reference clock signals. The UP signal is active when the frequency of the output clock signal is lower than the reference signal, while the DOWN signal is active when the frequency of the output clock signal is determined to be higher than the reference signal. Similarly, the UP signal is active when the phase of the output clock is lagging behind the phase of the reference clock, and the DOWN signal is active when the phase of the output clock is leading the phase of the reference clock.

BRIEF DESCRIPTION OF THE DRAWINGS

Non-limiting and non-exhaustive embodiments of the present invention are described with reference to the following drawings, in which.

DETAILED DESCRIPTION

Figure 1:
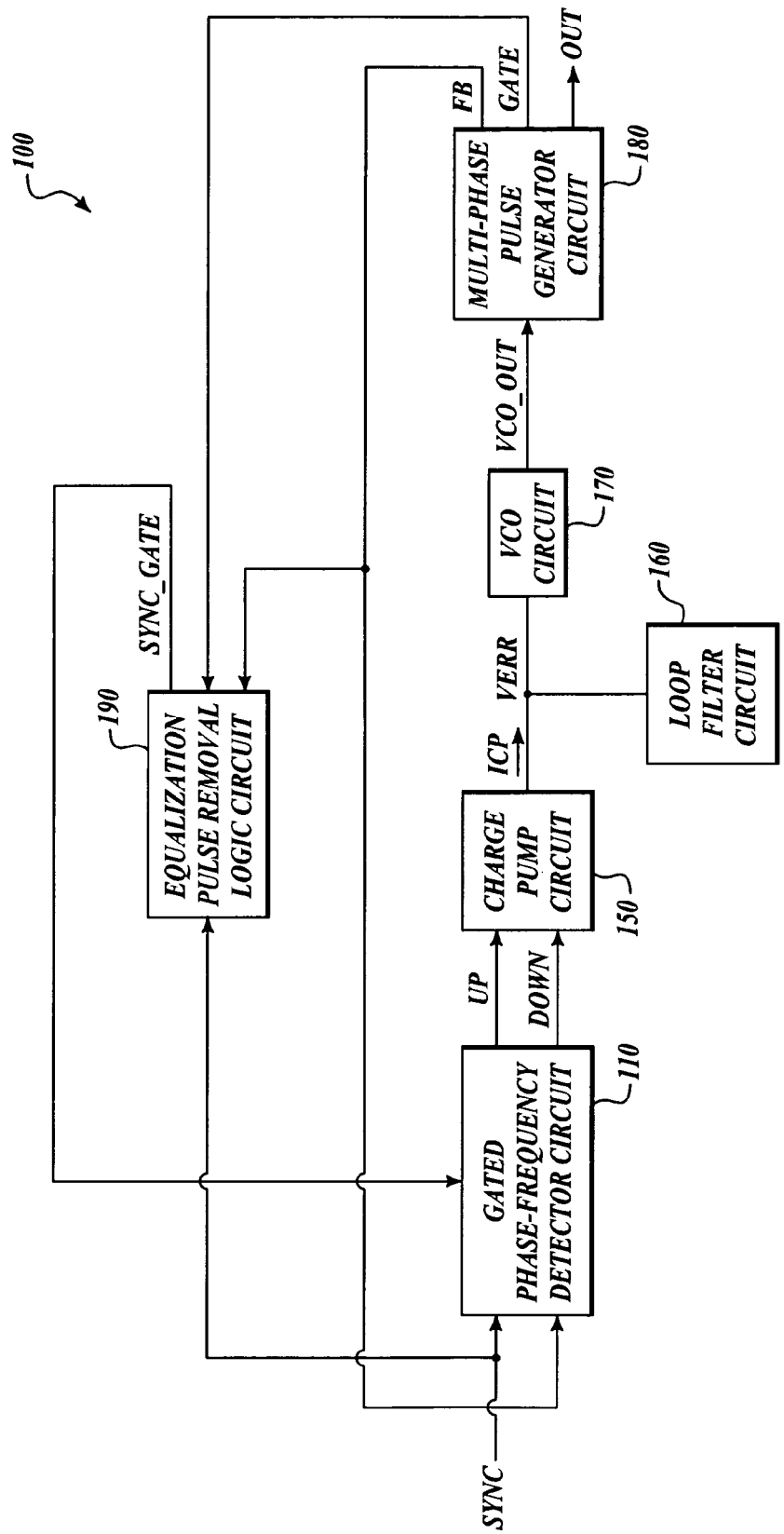
FIG. 1 illustrates a block diagram of an embodiment of a phase-locked loop circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below are not intended to limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, the invention is related to a phase-locked loop circuit that is arranged for equalizing pulse removal. The phase-locked loop circuit includes a multi-phase pulse generator circuit that is arranged to provide a feedback signal and a gate signal from an output of a voltage-controlled oscillation circuit. The gate signal leads the feedback signal by approximately one-fourth of a period. Also, an equalizing pulse removal logic circuit is arranged to provide a sync gate signal from the feedback signal, the gate signal, and a sync signal. The sync gate signal is provided such that, if the sync signal includes equalizing pulses, the sync gate signal corresponds to an inactive logic level during each equalizing pulse. A phase-frequency detector of the phase-locked loop circuit is gated such that the phase-frequency detector is not changed by the sync signal if the sync gate signal corresponds to the inactive logic level.

FIG. 1 illustrates a block diagram of an embodiment of PLL circuit 100. PLL circuit 100 includes components such as gated phase-frequency detector circuit 110, charge pump circuit 150, loop filter circuit 160, VCO circuit 170, multi-phase generator circuit 180, and equalizing pulse removal logic circuit 190.

Gated phase-frequency detector circuit 110 may be arranged to provide signals UP and DOWN based, in part, on sync signal Sync, feedback signal FB, and sync gate signal Sync_gate. Signal Sync may be a composite sync signal, such as an NTSC composite sync signal, or the like.

Further, gated phase-frequency detector circuit 110 may be arranged such that, if signal Sync_gate corresponds to an active logic level, gated phase-frequency circuit 110 provides signals UP and DOWN in substantially the same manner as a phase-frequency detector. However, gated phase-frequency detector circuit 110 is further arranged such that, if signal Sync_gate corresponds to an inactive logic level, a logic level that is associated with signal UP remains the same, regardless of signal Sync.

In one embodiment, a flip-flop (not shown in FIG. 1) in gated phase-frequency detector circuit 110 is triggered on the rising edges of signal Sync if signal Sync_gate corresponds to an active logic level. In this embodiment, if signal Sync_gate corresponds to an inactive logic level, rising edges of signal Sync are ignored by gated phase-frequency detector circuit 110.

In another embodiment, a flip-flop (not shown in FIG. 1) in gated phase-frequency detector circuit 110 is triggered on the falling edges of signal Sync if signal Sync_gate corresponds to an active logic level. In this embodiment, if signal Sync_gate corresponds to an inactive logic level, falling edges of signal Sync are ignored by gated phase-frequency detector circuit 110.

Also, charge pump circuit 150 may be configured to provide charge pump current Icp responsive to signals UP and DOWN. Loop filter circuit 160 may be arranged to provide error signal Verr in response to current Icp. VCO circuit 170 is arranged to provide oscillator output signal VCO_out from signal Verr.

Multi-phase pulse generator circuit 180 may be arranged to provide signal FB by dividing a frequency that is associated with signal VCO_out. In one embodiment, multi-phase pulse generator circuit 180 is arranged to provide signal FB such that signal FB has a period of approximately 63.5 $\mu$s. Multi-phase pulse generator circuit 180 may be further arranged to provide signals Gate and OUT such that signals Gate and OUT have substantially the same frequency as signal FB, but different phases than signal FB. In one embodiment, the phase of signal OUT is adjustable, and the phase of signal Gate leads the phase of signal FB by approximately 90 degrees (i.e. one-fourth of a period).

Equalizing pulse removal logic circuit 190 is arranged to provide signal Sync_gate based, in part, on signals FB, Gate, and Sync. Equalizing pulse removal circuit 190 may be arranged to provide signal Sync such that, if equalizing pulses are occurring in the sync signal, half of the pulses in signal Sync are ignored by gated phase-frequency detector circuit 110. Accordingly, each of the equalizing pulses may be ignored by gated phase-frequency detector circuit 110. In one embodiment, equalizing pulse removal circuit 190 is arranged to provide signal Sync_gate such that signal Sync_gate is substantially the same as signal Gate if signal FB is locked to signal Gate.

During the horizontal sync interval of an NTSC composite sync signal, the period is about 63.5 $\mu$s. However, the NTSC composite sync period includes equalizing pulses during a vertical blanking interval. When an NTSC composite sync signal includes equalizing pulses, the period of the signal is about 31.8 $\mu$s. Equalizing pulse removal logic circuit 190 may be arranged such that, if the period of signal Sync is about 31.8 $\mu$s, gated phase-frequency detector circuit 110 ignores half of the pulses in signal Sync, so that the period of signal Out remains unchanged (e.g. remains at about 63.5 $\mu$s) even if equalizing pulses occur in signal Sync.

Figure 2:
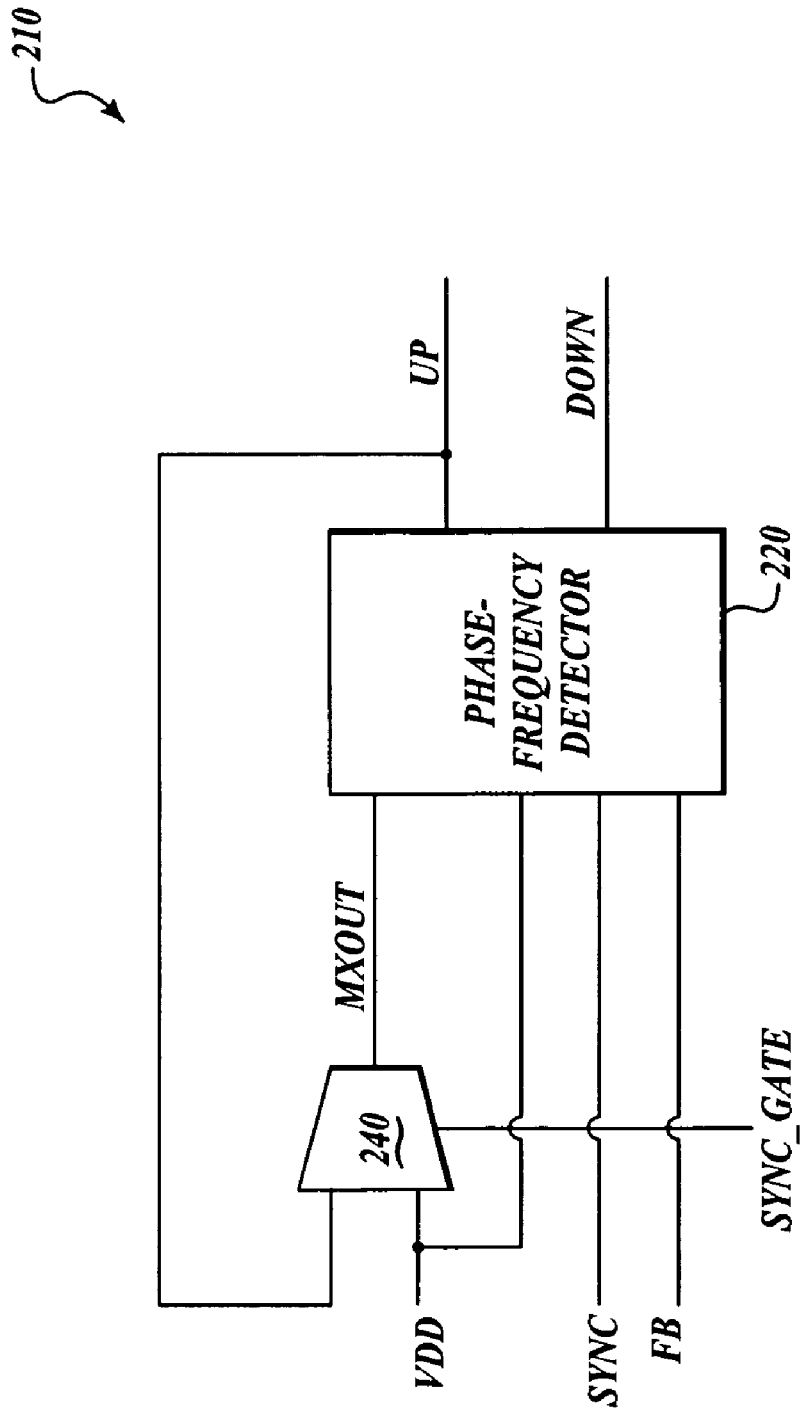
FIG. 2 shows a block diagram of an embodiment of the gated phase-frequency detector circuit of FIG. 1.

FIG. 2 shows a block diagram of an embodiment of gated phase-frequency detector circuit 210. Gated phase-frequency detector circuit 210 may operate in a substantially similar manner to gated phase-frequency detector circuit 110 of FIG. 1, and may operate in a different manner in some ways. Gated phase-frequency detector circuit 210 includes multiplexer circuit 240 and phase-frequency detector (PFD) 220.

PFD 220 may be arranged to provide signals UP and DOWN at up and down outputs respectively of PFD 220 based, in part, on the phases and frequencies of signals Sync and FB. PFD 220 may be arranged to receive: signal MXout at a first detector input, signal VDD at a second detector input, signal Sync at a reference input, and signal FB at a feedback input.

Multiplexer circuit 240 may be arranged to receive signal UP at a first multiplexer input, to receive signal VDD at a second multiplexer input, and to receive signal Sync_gate at a select multiplexer input. Also, multiplexer circuit 240 may be arranged to provide multiplexer output signal Mxout at a multiplexer output of multiplexer circuit 240 by multiplexing signals UP and VDD based on signal Sync_gate. Accordingly, multiplexer circuit 240 may be arranged to provide signal MXout such that signal MXout corresponds to a logic high if signal Sync_gate corresponds to an active logic level, and such that signal MXout corresponds to a logic level that is associated with signal UP if signal Sync_gate corresponds to an inactive logic level.

Although multiplexer circuit 240 is shown as receiving signal VDD, multiplexer circuit 240 may instead receive virtually any signal that provides a logic "high" instead of VDD. Also, in other embodiment, multiplexer 240 may instead receive virtually any signal that receives a logic "low".

Figure 3:
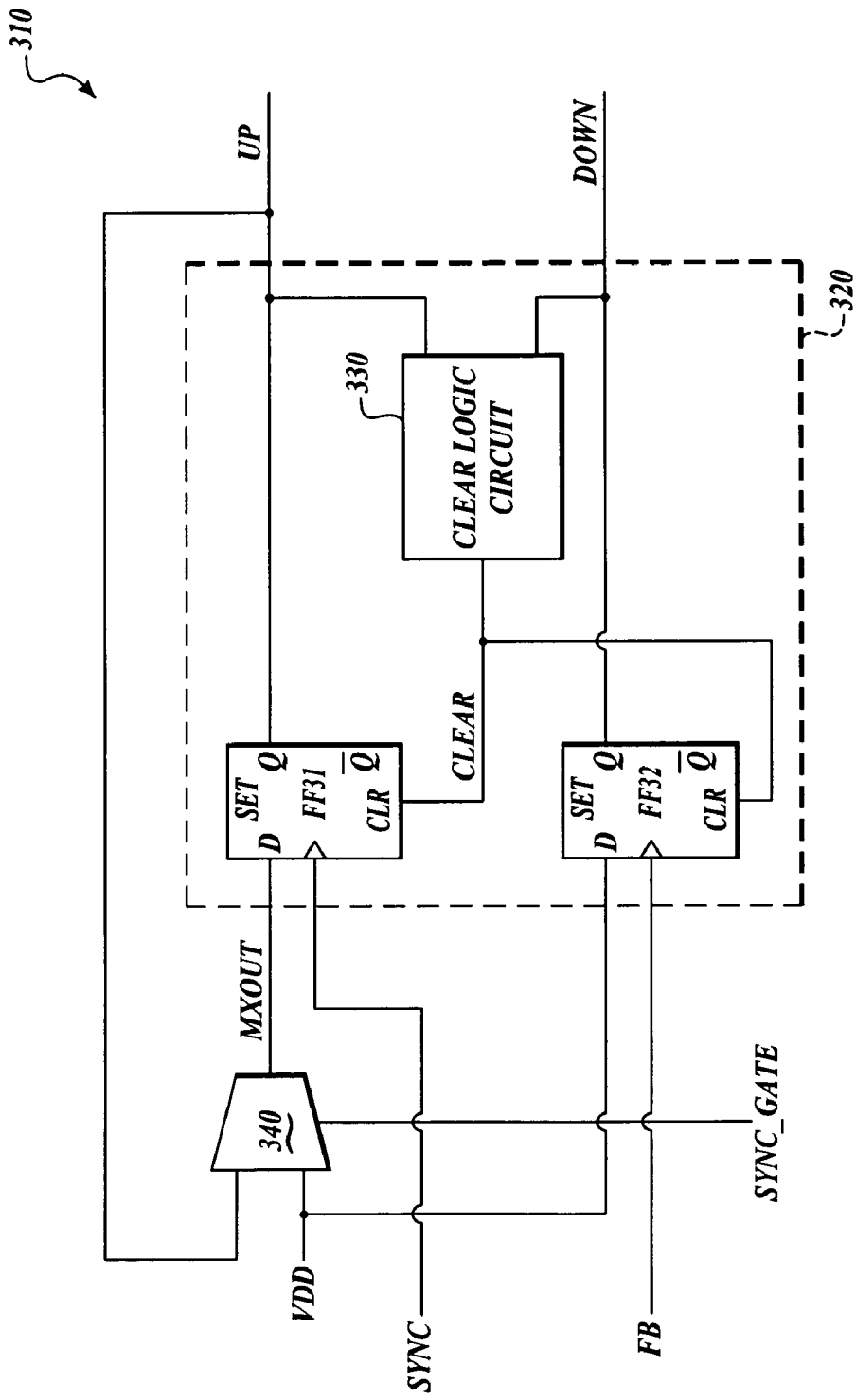
FIG. 3 illustrates a block diagram of an embodiment of the gated phase-frequency detector circuit of FIG. 2 in which an embodiment of the phase-frequency detector of FIG. 2 is shown.

FIG. 3 illustrates a block diagram of an embodiment of gated phase-frequency detector circuit 310, in which an embodiment of a PFD is shown. Components in gated phase-frequency detector circuit 310 may operate in a substantially similar manner to similarly-named components in gated phase-frequency detector circuit 210 of FIG. 2, and may operate in a different manner in some ways. PFD 320 includes flip-flops FF31 and FF32, and clear logic circuit 330.

Flip-flop FF31 may be arranged to receive signal MXout at a D input, to receive signal Sync at a clock input, to receive signal CLEAR at a clear input, and to provide signal UP at a Q output. Also, flip-flop FF32 may be arranged to receive signal VDD at a D input, to receive signal FB at a clock input, to receive signal CLEAR at a clear input, and to provide signal DOWN at a Q output. Clear logic circuit 330 is arranged to provide signal CLEAR based, in part, on signals UP and DOWN.

Clear logic circuit 330 may be arranged to provide signal CLEAR by employing an AND function on signals UP and DOWN. Accordingly, clear logic circuit 330 may be arranged to provide signal CLEAR such that the signals UP and DOWN are reset if signals UP and DOWN both correspond to a high logic level.

In other embodiments, complementary logic may be employed such that clear logic circuit provides a NOR function on signals UP and DOWN such that signals UP and DOWN are reset if signal UP and DOWN both correspond to a low logic level.

Although D flip-flops are illustrated in FIG. 3, types of memory circuits other than D flip-flops may be employed in PFD 320, such as SR flip-flops, JK flip-flops, T flip-flops, latches, and the like.

Figure 4:
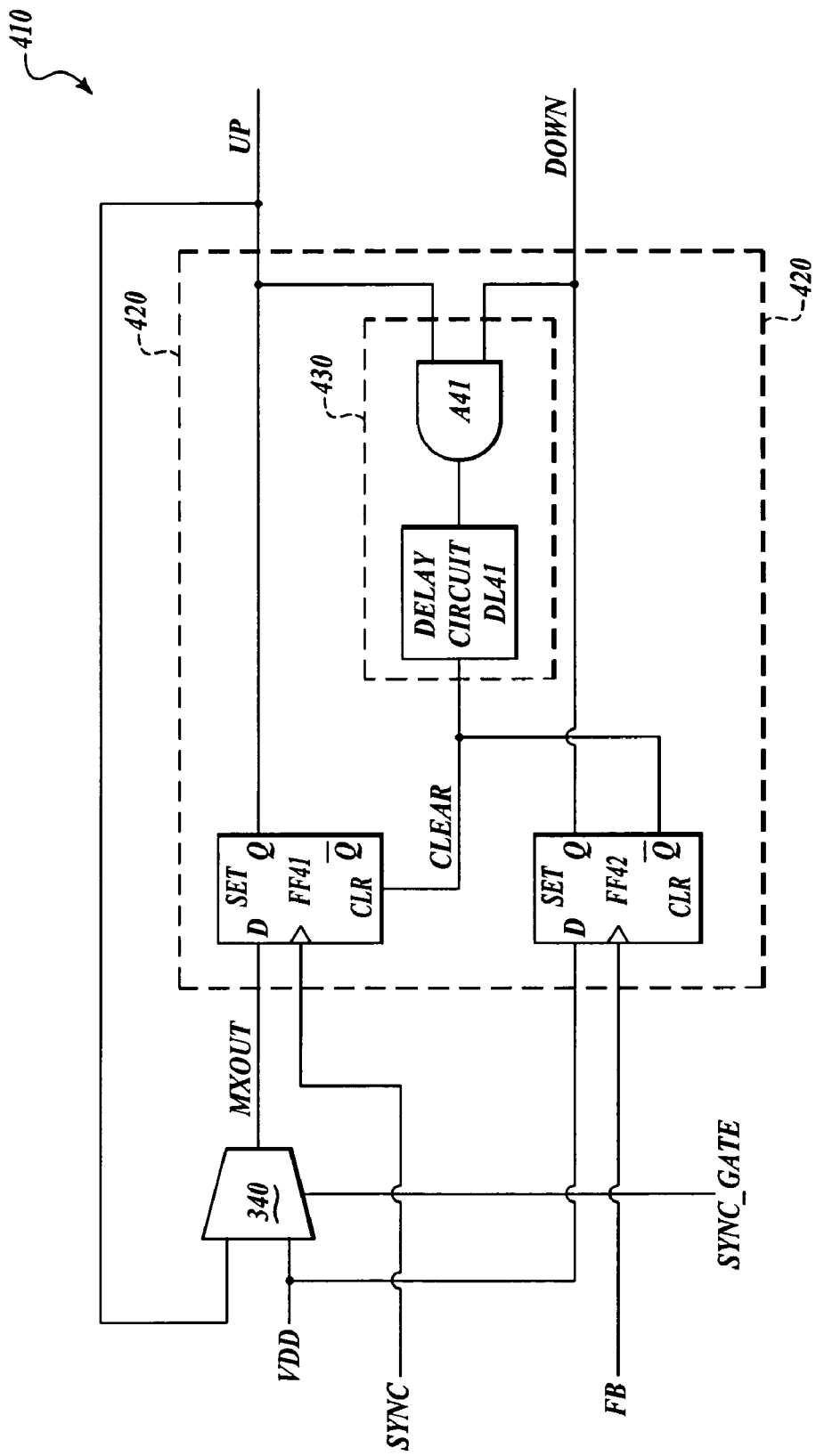
FIG. 4 shows a block diagram of an embodiment of the gated phase-frequency detector circuit of FIG. 3 in which an embodiment of the clear logic circuit of FIG. 3 is shown.

FIG. 4 shows a block diagram of an embodiment of gated phase-frequency detector circuit 410, in which an embodiment of a clear logic circuit is shown. Components in gated phase-frequency detector circuit 410 may operate in a substantially similar manner to similarly-named components in gated phase-frequency detector circuit 310 of FIG. 3, and may operate in a different manner in some ways. Clear logic circuit 430 includes AND gate A41 and delay circuit D41.

Figure 5:
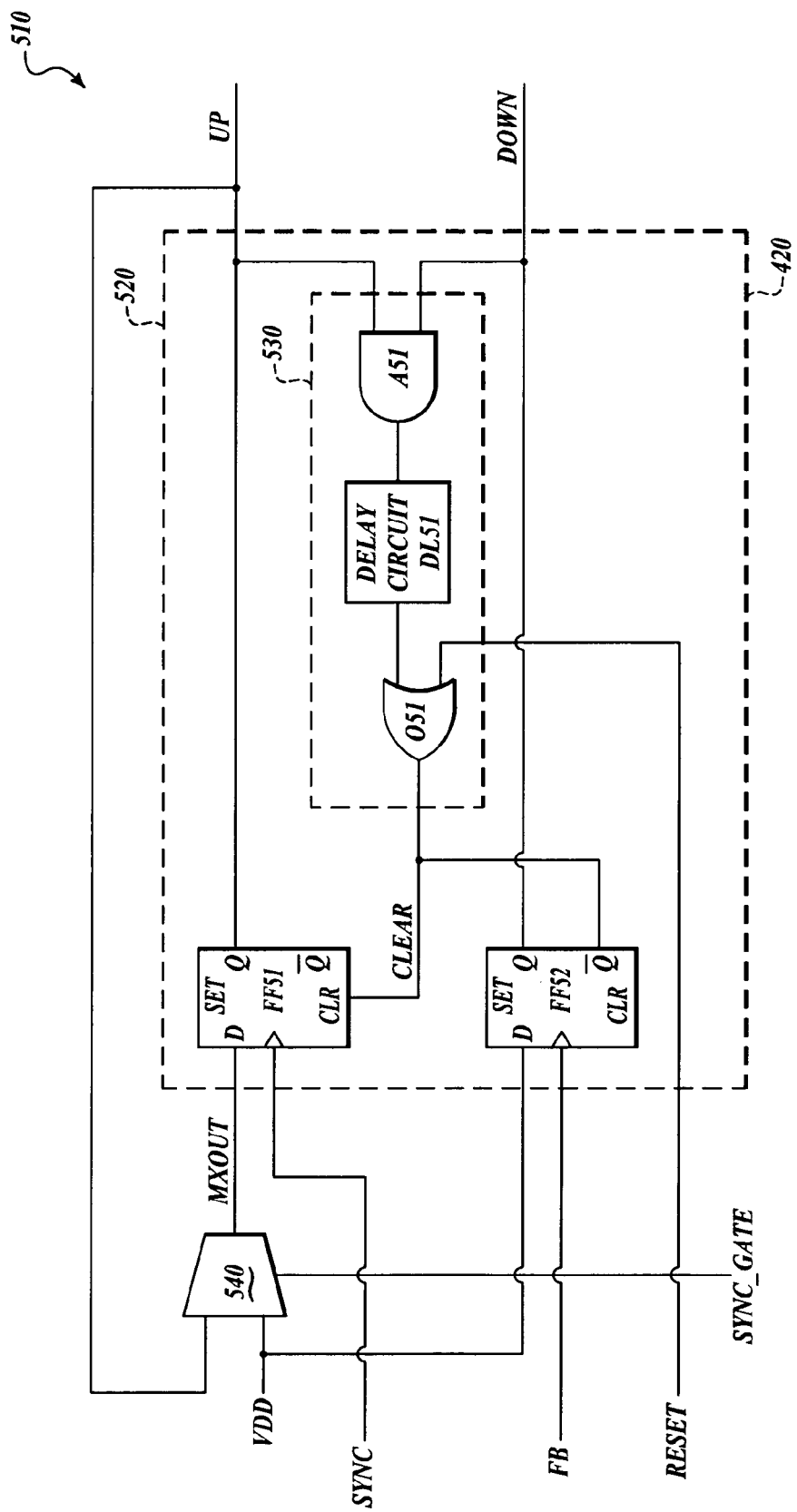
FIG. 5 illustrates a block diagram of an embodiment of the gated phase-frequency detector circuit of FIG. 3 in which another embodiment of the clear logic circuit of FIG. 3 is shown.

FIG. 5 illustrates a block diagram of an embodiment of gated phase-frequency detector circuit 510, in which another embodiment of a clear logic circuit is shown. Components in gated phase-frequency detector circuit 510 may operate in a substantially similar manner to similarly-named components in gated phase-frequency detector circuit 310 of FIG. 3, and may operate in a different manner in some ways. Clear logic circuit 530 includes AND gate A51, delay circuit D51, and OR gate O51.

Figure 6:
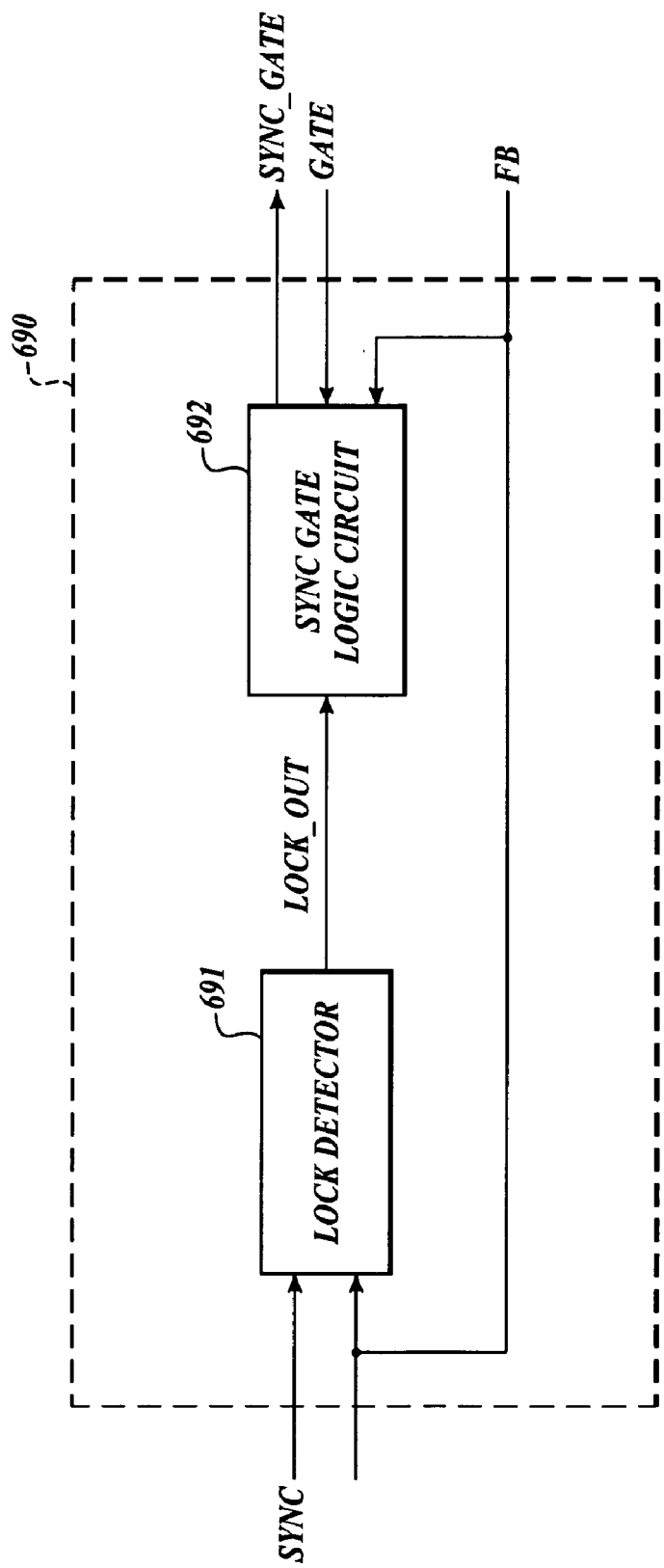
FIG. 6 shows a block diagram of an embodiment of the equalizing pulse removal logic circuit of FIG. 1.

FIG. 6 shows a block diagram of an embodiment of equalizing pulse removal logic circuit 690. Equalizing pulse removal logic circuit 690 may operate in a substantially similar manner to equalizing pulse removal logic circuit 190 of FIG. 1, and may operate in a different manner in some ways. Equalizing pulse removal logic circuit 690 includes lock detector 691 and sync gate logic circuit 692.

Lock detector 691 is arranged to determine whether phases associated with signals Sync and FB are substantially the same, and to provide signal lock_out based on the determination. Accordingly, signal lock_out corresponds to a first logic level (e.g. high) if signals Sync and FB have substantially the same phase, corresponds to a second logic level (e.g. low) otherwise. Signals Sync and FB are said to be locked if their phases are substantially the same.

Additionally, sync gate logic circuit 692 is arranged to provide signal Sync_gate based, in part, on signal lock_out, signal Gate, and signal FB. In one embodiment, sync gate logic circuit 692 is arranged to provide signal Sync_gate such that signal Sync_gate corresponds to an active logic level (e.g. high) if signal lock_out corresponds to an inactive logic level (e.g. low), and such that signal Sync_gate also corresponds to the active logic level if signal Gate corresponds to the first logic level (e.g. high). Sync gate logic circuit 692 may be arranged to provide signal Sync_gate such that signal Sync_gate corresponds to an active logic level under another condition that indicates that no equalizing pulses are occurring in signal Sync. Embodiments of sync gate logic circuit 692 are shown in greater detail with respect to FIGS. 8 and 9 below.

Figure 7:
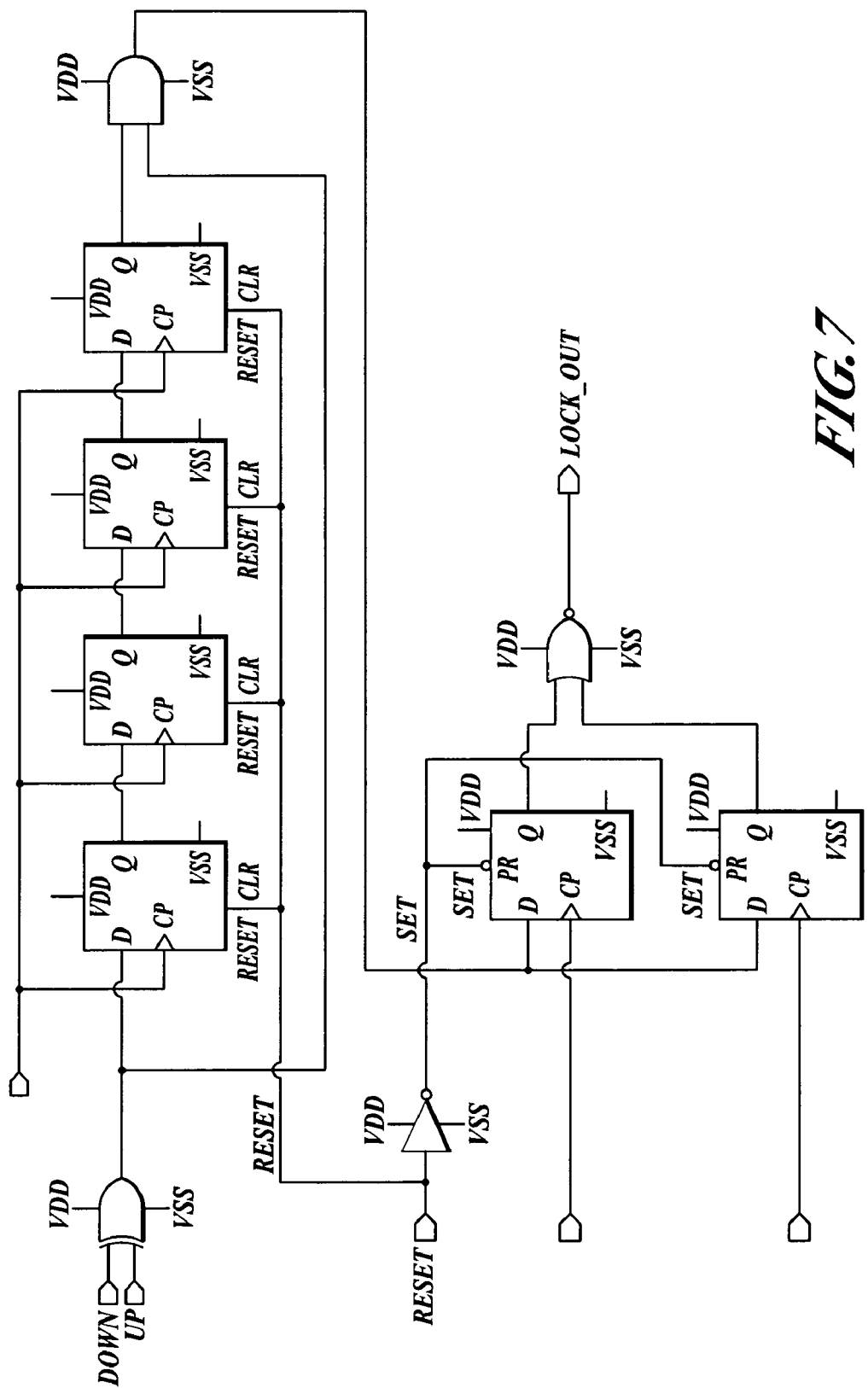
FIG. 7 illustrates a block diagram of an embodiment of the lock detector of FIG. 6.

FIG. 7 illustrates a block diagram of an embodiment of lock detector 791. Lock detector 791 may operate in a substantially similar manner to lock detector 691 of FIG. 6, and may operate in a different manner in some ways. Although the embodiment of lock detector 791 illustrated in FIG. 7 employs signals reset, VCO_out, UP and DOWN, other embodiments of lock detector 791 need not employ these signals.

Figure 8:
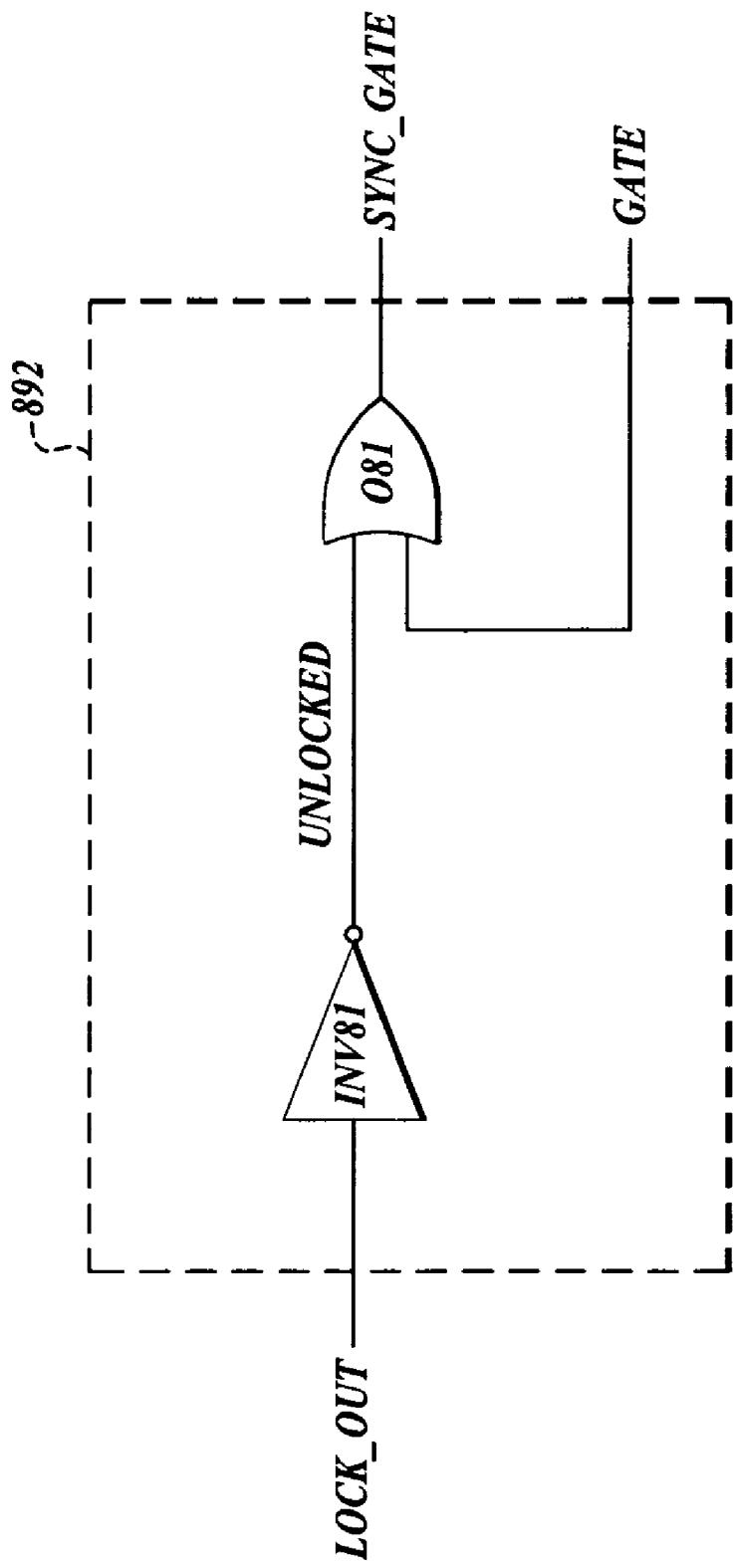
FIG. 8 shows a block diagram of an embodiment of the sync gate logic circuit of FIG. 6.

FIG. 8 shows a block diagram of an embodiment of sync gate logic circuit 892. Sync gate logic circuit 892 may operate in a substantially similar manner as sync gate logic circuit 692 of FIG. 6, and may operate in a different manner in some ways. Sync gate logic circuit 892 includes inverter Inv81 and OR gate O81.

Figure 11:
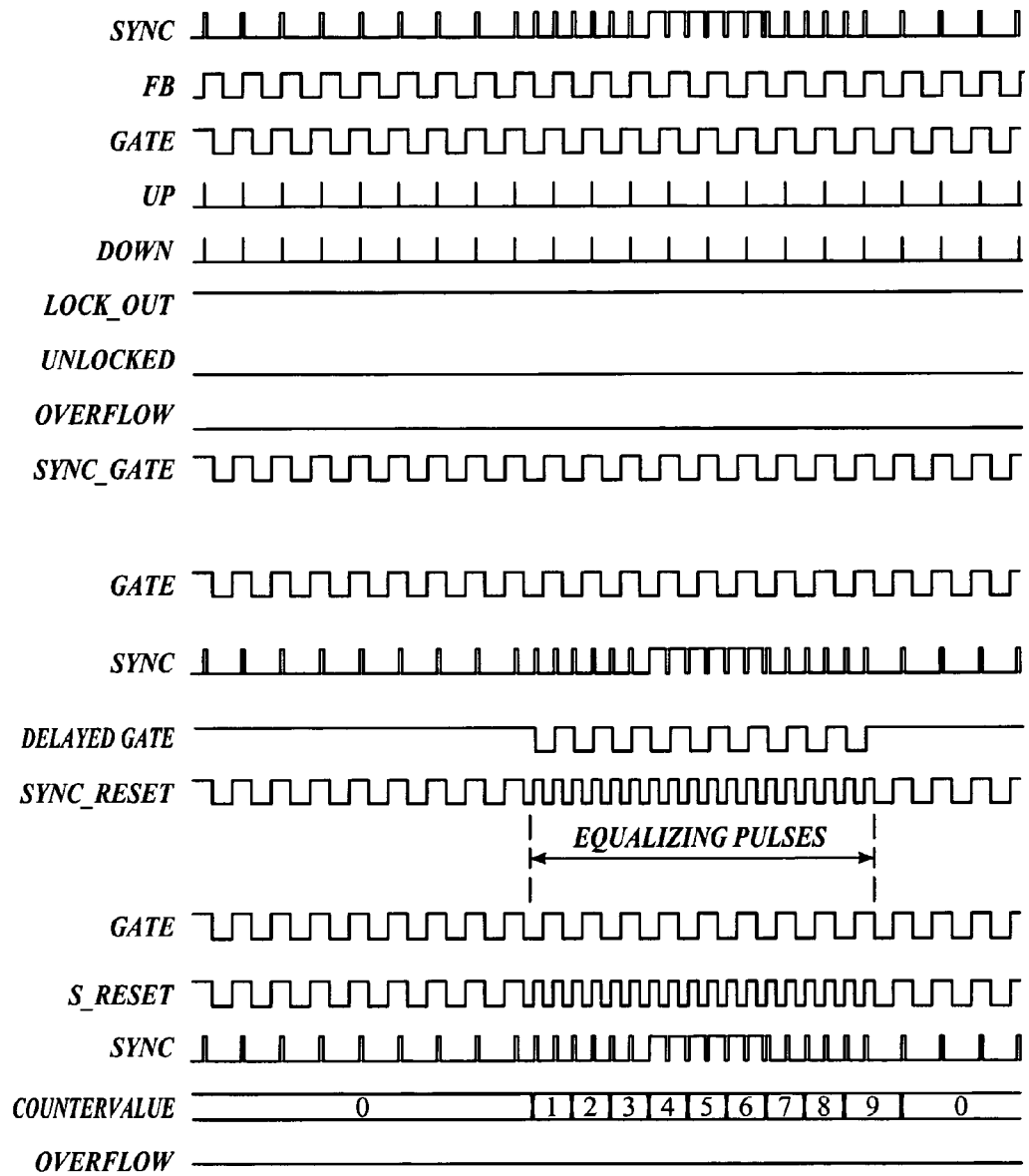
FIG. 11 illustrates a timing diagram of waveforms of embodiments of signals for an embodiment of a phase-locked loop circuit, arranged in accordance with aspects of the invention.

Inverter Inv81 is arranged to provide signal Unlocked from signal lock_out by inverting signal lock_out. OR gate O81 is arranged to provide signal Sync_gate by performing an OR function on signals Unlocked and Gate. Accordingly, when signals FB and Gate are locked, signal Sync_gate is substantially the same as signal Gate. If signal Sync is an NTSC composite sync signal and signals Sync and FB are locked, then during the horizontal sync interval, whenever signal Sync is high, signal Sync_gate is also high. However, if signal Sync has a period of about 31.8 $\mu$s, as when equalizing pulses occur in signal Sync, then signal Sync_gate may be low during half of the pulses in signal Sync. Accordingly, the gated phase-frequency detector circuit (e.g. gated phase-frequency detector circuit 110 of FIG. 1) may ignore the equalizing pulses. Waveforms of embodiments of signals Sync, Gate, Sync_gate, and FB are illustrated in FIG. 11, which is discussed in greater detail below.

Figure 9:
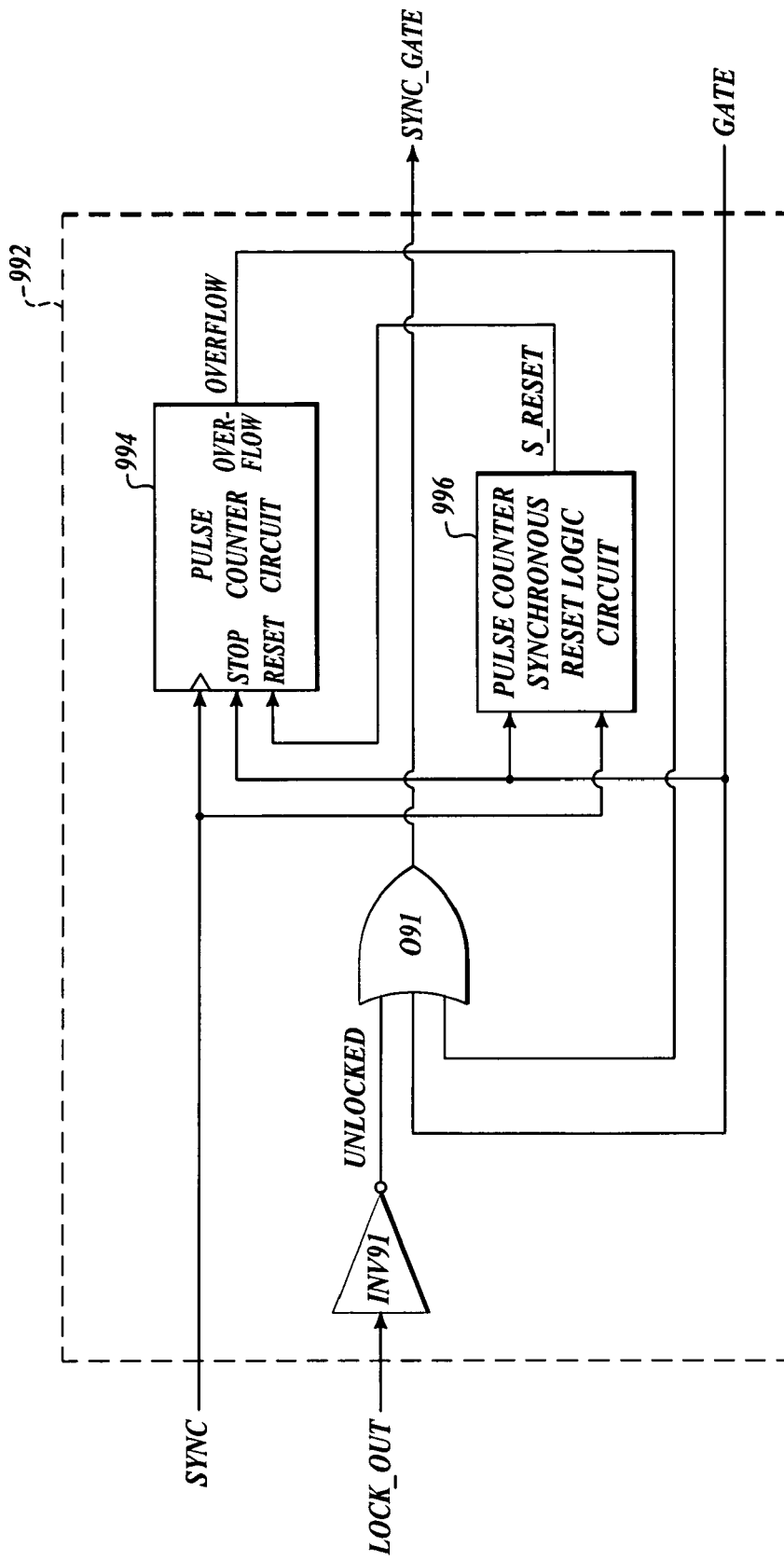
FIG. 9 illustrates a block diagram of another embodiment of the sync gate logic circuit of FIG. 6.

FIG. 9 illustrates a block diagram of sync gate logic circuit 992. Sync gate logic circuit 992 may operate in a substantially similar manner as sync gate logic circuit 692 of FIG. 6, and may operate in a different manner in some ways. Sync gate logic circuit 992 includes inverter Inv91, three-input OR gate O91, pulse counter circuit 994, and pulse counter synchronous reset logic circuit 996.

Inverter Inv91 is configured to provide signal Unlocked from signal lock_out. OR gate O91 is arranged to provide signal Sync_gate from signals Unlocked, Gate, and Overflow.

Pulse counter circuit 994 is arranged to receive signal Gate at a stop input so that, when signal Sync corresponds twice the horizontal sync NTSC frequency, half of the pulses are counted. In another embodiment, a stop input may not be employed, so that all of the pulses are counted.

Pulse counter circuit 994 may be arranged such that signal overflow is asserted if a large number of pulses occur in signal Sync that are at approximately twice the horizontal sync NTSC frequency. Sync gate logic circuit 992 is configured to provide signal Sync_gate so that signal Sync_gate is substantially the same as signal Gate if equalizing pulses are occurring in signal Sync. However, if signal Sync is a progressive scan signal, or the like, pulses in signal Sync may have a similar frequency as a signal with interleaved equalizing pulses. If signal Sync is a progressive scan signal, it is preferable to not ignore any pulses in signal Sync, even though the frequency of signal Sync is substantially the same as the frequency a signal in which interleaved equalizing pulses occur. Accordingly, if a large number of pulses (e.g. more than 9) occur at approximately twice the horizontal sync NTSC frequency, then the pulses are probably not equalizing pulses, but instead are probably pulses from a progressive scan signal, or the like. Accordingly, if a large number of pulses occur at approximately twice the horizontal sync NTSC frequency, sync gate logic circuit 992 provides signal Sync_out at an active logic level.

Pulse counter circuit 994 is a counter circuit that is arranged to increment a value if a rising edge occurs in signal Sync while signal Gate is low and signal S_reset is inactive (e.g. low). Pulse counter circuit 994 is further arranged such that the value resets (e.g. to zero) if signal S_reset is active (e.g. high) when a rising edge occurs in signal Sync. Also, pulse counter circuit 994 is arranged to assert signal Overflow if the value overflows. In one embodiment, pulse counter circuit 994 is a five-bit counter, and the value overflows if the value reaches 31 before being reset. In other embodiments, pulse counter circuit 994 may have a number of bits other than five.

Additionally, pulse counter circuit 994 is arranged to reset responsive to signal S_reset when signal Sync resumes the horizontal sync NTSC frequency. Pulse counter reset logic circuit 996 is arranged to provide signal S_reset based, in part, on signals Sync and Gate.

Figure 10:
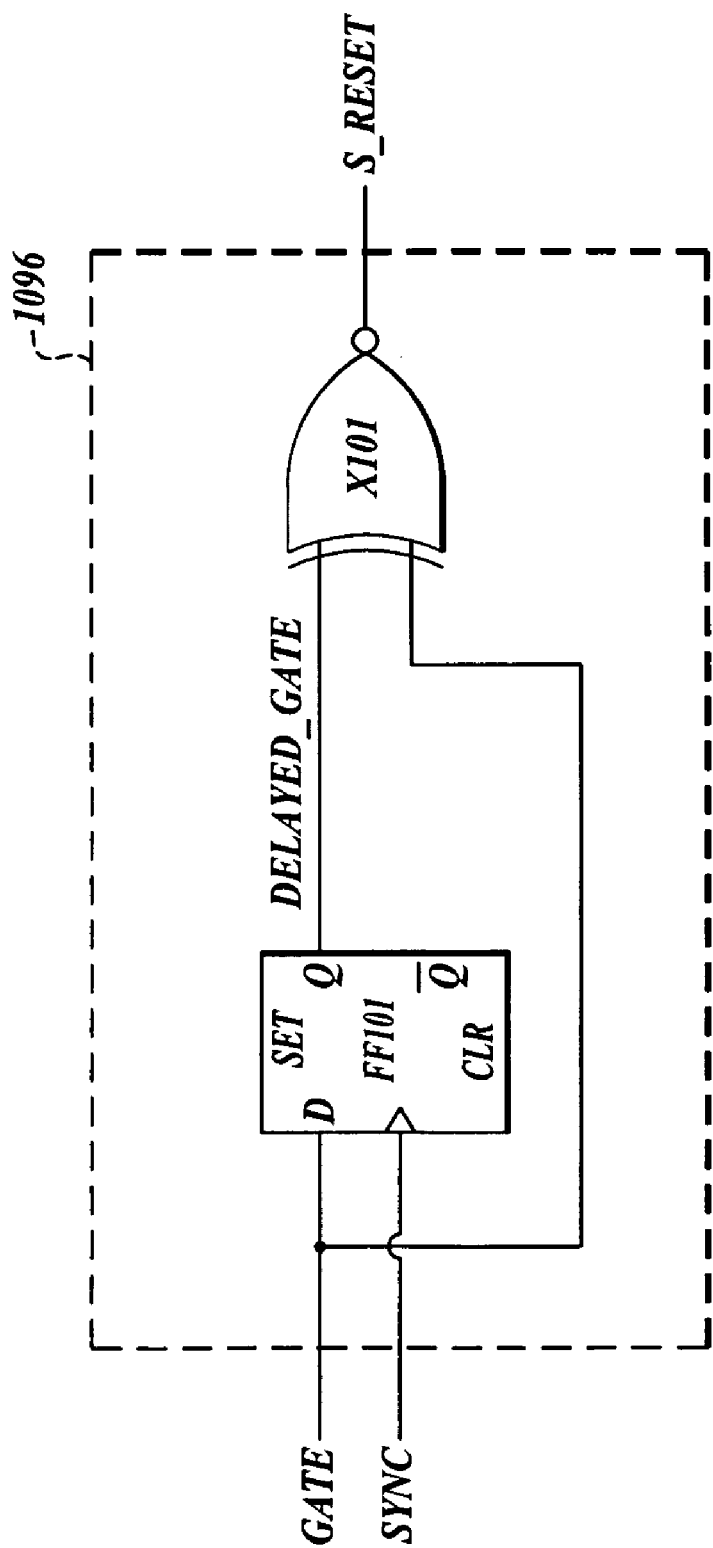
FIG. 10 shows a block diagram of an embodiment of the pulse counter synchronous reset logic circuit of FIG. 9.

FIG. 10 shows a block diagram of an embodiment of pulse counter synchronous reset logic circuit 1096. Pulse counter synchronous reset logic circuit 1096 is arranged to operate in a substantially similar manner to pulse counter synchronous reset logic circuit 996 of FIG. 9, and may operate in a different manner in some ways. Pulse counter synchronous reset logic circuit 1096 includes flip-flop FF101 and XNOR gate X101.

Flip-flop FF101 is arranged to provide signal Delayed_gate from signals Gate and Sync. Additionally, XNOR gate O101 is arranged to provide signal S_reset from signals Delayed_gate and Gate. Timing of signals in FIG. 10 may be more easily understood with reference to FIG. 11 below.

FIG. 11 illustrates a timing diagram of waveforms of embodiments of signals for an embodiment of a phase-locked loop circuit that is arranged in accordance with aspects of the invention.

For the waveforms illustrated in FIG. 11, signals Sync and FB are locked, and signal Unlocked corresponds to a logic low accordingly. Signal Gate leads signal FB by approximately 90 degrees, as shown in FIG. 11. Since signal Unlocked corresponds to a logic low, and since signal Overflow is not asserted, signal Sync_gate is substantially the same as signal Gate.

As further shown in FIG. 11, signal Delayed_gate corresponds to a logic high until the equalizing pulses occur. When the equalizing pulses occur, signal Delayed_gate corresponds to a delayed version of signal Gate. Also, signal S_reset may be provided by an XNOR function between signals Delayed_gate and Gate. The frequency of signal S_reset approximately doubles during the equalizing pulses. During the equalizing pulses, signal S_reset is not high on rising edges of signal Sync, so that pulse counter circuit 994 is not reset during the equalizing pulses.

Further, as shown in FIG. 11, the counter value (e.g. the value of pulse counter circuit 994) increments on a rising edge of signal Sync if signals Gate and S_reset are both low. Accordingly, the counter value increments at every other pulse in signal Sync. When the equalizing pulses end, signal S_reset is high during the next rising edge of signal Sync. Accordingly, the counter value resets to zero when the equalizing pulses end.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A phase-locked loop circuit, comprising:
 a gated phase-frequency detector circuit;
 a charge pump circuit that is coupled to the gated phase-frequency detector circuit;
 a loop filter circuit that is coupled to the charge pump circuit;
 a voltage-controlled oscillator circuit that is coupled to the loop filter circuit;
 multi-phase pulse generator circuit that is coupled to the voltage-controlled oscillator circuit and the gated phase-frequency detector circuit; and
 an equalizing pulse removal logic circuit that is coupled to the multi-phase pulse generator circuit and the gated phase-frequency detector circuit.

2. The circuit of claim 1, wherein the gated phase-frequency detector circuit includes a multiplexer circuit and a phase-frequency detector that is coupled to the multiplexer circuit.

3. The circuit of claim 2, wherein the phase-frequency detector that includes first and second detector inputs, a reference input, a feedback input, an up output, and a down output; the multiplexer circuit includes first and second multiplexer inputs, a select multiplexer input, and a multiplexer output; the first multiplexer input is coupled to the up output; and wherein the multiplexer output is coupled to the first detector input.

4. The circuit of claim 3, wherein the multiplexer circuit is further arranged to receive to receive a logic high signal at the first multiplexer input.

5. The circuit of claim 1, wherein the equalizing pulse removal logic circuit includes a lock detector circuit.

6. The circuit of claim 5, wherein the gated phase-frequency detector circuit is arranged to receive a sync signal, a feedback signal, and a sync gate signal, and further arranged to provide up and down signals; the charge pump circuit is arranged to provide a charge pump current based, in part, on the up and down signals; the loop filter circuit is arranged to provide an error voltage based, in part, on the charge pump current; the voltage-controlled oscillator circuit is arranged to provide a voltage-controlled oscillator output signal based, in part, on the error voltage; the multi-phase generator circuit is arranged to provide the feedback signal and a gate signal based, in part, on the voltage-controlled oscillator output signal; and wherein the lock detector circuit is arranged to provide a lock detector output signal based, in part, on the sync signal and the feedback signal.

7. The circuit of claim 6, wherein the equalizing pulse removal circuit is arranged to provide the sync gate signal such that, if equalizing pulses are occurring in the sync signal, the equalizing pulses are ignored by the gated phase-frequency detector circuit.

8. The circuit of claim 6, wherein the gated phase-frequency detector circuit is arranged such that a triggering edge of the sync gate signal does not affect the UP signal if the sync gate signal corresponds to an active logic level.

9. The circuit of claim 8, wherein the lock detector circuit is arranged to provide the lock detector output signal such that the lock detector circuit corresponds to a first logic level if the feedback signal is substantially locked to the sync signal; and wherein the multi-phase pulse generator circuit is arranged to provide the feedback signal and the gate signal such that the feedback signal and the gate signal have substantially the same frequency, and such that the gate signal leads the feedback signal.

10. The circuit of claim 9, wherein the multi-phase pulse generator circuit is arranged to provide the gate signal such that the gate signal leads the feedback signal by approximately one-fourth of a period.

11. The circuit of claim 9, wherein the equalizing pulse removal logic circuit further includes a sync gate logic circuit that is arranged to provide a sync gate signal such that the sync gate signal corresponds to an active logic level if the lock detector output signal corresponds to an inactive logic level, and such that the sync gate signal corresponds to the active logic level if the gate signals corresponds to the first logic level.

12. The circuit of claim 11, wherein the sync gate logic circuit includes an OR gate that is arranged to provide the sync gate signal based, in part, on the lock detector output signal and the gate signal.

13. The circuit of claim 11, wherein the equalizing pulse removal logic circuit further includes a pulse counter circuit that includes an overflow output, wherein the pulse counter circuit is arranged to provide an overflow signal at the overflow output, and wherein the sync gate signal also corresponds to an active logic level if the overflow signal is asserted.

14. The circuit of claim 13, wherein the sync gate logic circuit includes an OR gate that is arranged to provide the sync gate signal based, in part, on the lock detector output signal, the gate signal, and the overflow signal.

15. The circuit of claim 13, wherein pulse counter circuit further includes a synchronous reset, and wherein the equalizing pulse removal logic circuit further includes a pulse counter synchronous reset logic circuit that is arranged to provide a synchronous reset signal to the synchronous reset based, in part, on the gate signal and the sync signal.

16. The circuit of claim 15, wherein the pulse counter synchronous reset logic circuit includes a flip-flop that is arranged to provide a delayed gate signal based on the gate signal and the sync signal.

17. The circuit of claim 16, wherein the pulse counter synchronous reset logic circuit further includes an XNOR gate that is arranged to provide the synchronous reset signal based on the delayed gate signal and the gate signal.

18. A method for equalizing pulse removal, comprising:
employing a phase-frequency detector to provide up and down signals based, in part, on a sync signal and a feedback signal;
providing a voltage-controlled oscillation output signal based, in part, on the up and down signals;
providing a feedback signal based, in part, on the voltage-controlled oscillation output signal;
providing a gate signal based, in part, on the voltage-controlled oscillation output signal such that the gate signal leads the feedback signal; and
gating the phase-frequency detector circuit if equalizing pulses occur in the sync signal during at least some of the equalizing pulses.

19. The method of claim 18, wherein gating the phase-frequency detector circuit includes:
determining if the feedback signal and the sync signal are locked;
providing a sync gate signal based, in part, on the gate signal and the determination of whether the feedback signal and the sync signal are locked;
multiplexing the up signal and another signal based on the sync gate signal to provide a multiplexer output signal; and
providing the multiplexer output signal to the phase-frequency detector.

20. A phase-locked loop circuit, comprising:
means for employing a phase-frequency detector to provide up and down signals based, in part, on a sync signal and a feedback signal;
means for providing a voltage-controlled oscillation output signal based, in part, on the up and down signals;
means for providing a feedback signal based, in part, on the voltage-controlled oscillation output signal;
means for providing a gate signal based, in part, on the voltage-controlled oscillation output signal such that the gate signal leads the feedback signal; and
means for gating the phase-frequency detector circuit if equalizing pulses occur in the sync signal during at least some of the equalizing pulses.

* * * * *

UNITED STATES PATENT AND TRADEMARK OFFICE
CERTIFICATE OF CORRECTION

PATENT NO. : 6,998,886 B1
APPLICATION NO. : 10/881483
DATED : February 14, 2006
INVENTOR(S) : Hon Kin Chiu Page 1 of 1

It is certified that error appears in the above-identified patent and that said Letters Patent is hereby corrected as shown below:

Title page,
Item [73], Assignee, delete "National Semiconductor Company" and substitute -- National Semiconductor Corporation --.
Item [74], *Attorney, Agent, or Firm*, after "Darby & Darby" delete "PC;" and insert -- P.C. --.

Column 4,
Line 40, delete "Mxout" and insert -- MXout --.

Column 8,
Line 32, delete "to receive" (second occurrence).

Signed and Sealed this

Twenty-seventh Day of June, 2006

JON W. DUDAS
*Director of the United States Patent and Trademark Office*